(12) United States Patent
Lu et al.

(10) Patent No.: US 11,404,576 B2
(45) Date of Patent: Aug. 2, 2022

(54) DIELECTRIC FIN STRUCTURE

(71) Applicant: Taiwan Semiconductor Manufacturing Company, Ltd., Hsinchu (TW)

(72) Inventors: Yu-Shan Lu, Hsinchu County (TW); Chung-I Yang, Hsinchu (TW); Kuo-Yi Chao, Hsinchu (TW); Wen-Hsing Hsieh, Hsinchu (TW); Jiun-Ming Kuo, Taipei (TW); Chih-Ching Wang, Kinmen County (TW); Yuan-Ching Peng, Hinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/069,409

(22) Filed: Oct. 13, 2020

(65) Prior Publication Data
US 2022/0115530 A1 Apr. 14, 2022

(51) Int. Cl.
*H01L 29/78* (2006.01)
*H01L 29/66* (2006.01)
*H01L 29/423* (2006.01)

(52) U.S. Cl.
CPC ...... *H01L 29/785* (2013.01); *H01L 29/42392* (2013.01); *H01L 29/6681* (2013.01); *H01L 29/66545* (2013.01); *H01L 2029/7858* (2013.01)

(58) Field of Classification Search
CPC ............ H01L 29/785; H01L 29/42392; H01L 29/66545; H01L 29/6681
See application file for complete search history.

(56) References Cited

U.S. PATENT DOCUMENTS

| | | | |
|---|---|---|---|
| 9,818,872 B2 | 11/2017 | Ching et al. | |
| 9,887,269 B2 | 2/2018 | Ching et al. | |
| 9,899,398 B1 | 2/2018 | Colinge et al. | |
| 10,032,627 B2 | 7/2018 | Lee et al. | |
| 10,109,721 B2 | 10/2018 | Lin et al. | |
| 10,157,799 B2 | 12/2018 | Ching et al. | |
| 10,199,502 B2 | 2/2019 | Huang et al. | |
| 10,290,546 B2 | 5/2019 | Chiang et al. | |
| 10,475,902 B2 | 11/2019 | Lee et al. | |
| 2017/0278928 A1* | 9/2017 | Tung | H01L 21/02634 |
| 2018/0175036 A1 | 6/2018 | Ching et al. | |
| 2018/0197789 A1* | 7/2018 | Glass | H01L 29/1054 |
| 2020/0091142 A1* | 3/2020 | Ching | H01L 29/0653 |
| 2021/0242206 A1* | 8/2021 | Lin | H01L 21/31111 |

* cited by examiner

*Primary Examiner* — Christine A Enad
(74) *Attorney, Agent, or Firm* — Haynes and Boone, LLP

(57) ABSTRACT

A semiconductor device according to the present disclosure includes a dielectric fin having a helmet layer, a gate structure disposed over a first portion of the helmet layer and extending along a direction, and a dielectric layer adjacent the gate structure and disposed over a second portion of the helmet layer. A width of the first portion along the direction is greater than a width of the second portion along the direction.

20 Claims, 17 Drawing Sheets

DIELECTRIC FIN STRUCTURE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Multi-bridge-channel (MBC) transistors are examples of multi-gate devices that have become popular and promising candidates for high performance and low leakage applications. An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reasons, an MBC transistor may also be referred to as a nanowire transistor or a nanosheet transistor.

Dielectric fins of MBC transistors define and separate adjacent source/drain features. In some instances, a sacrificial cladding layer is deposited over a fin-shaped structure that includes sacrificial layer and channel layers. The sacrificial cladding layer and the sacrificial layers may be selectively removed later to release the channel layers as bridge-like channel members. If the sacrificial cladding layer is not sufficiently removed during formation of source/drain openings, the inner spacer layer that is deposited afterwards may not have sufficient thickness to prevent a short between the gate structure and a source/drain feature. While conventional dielectric fins are generally satisfactory for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
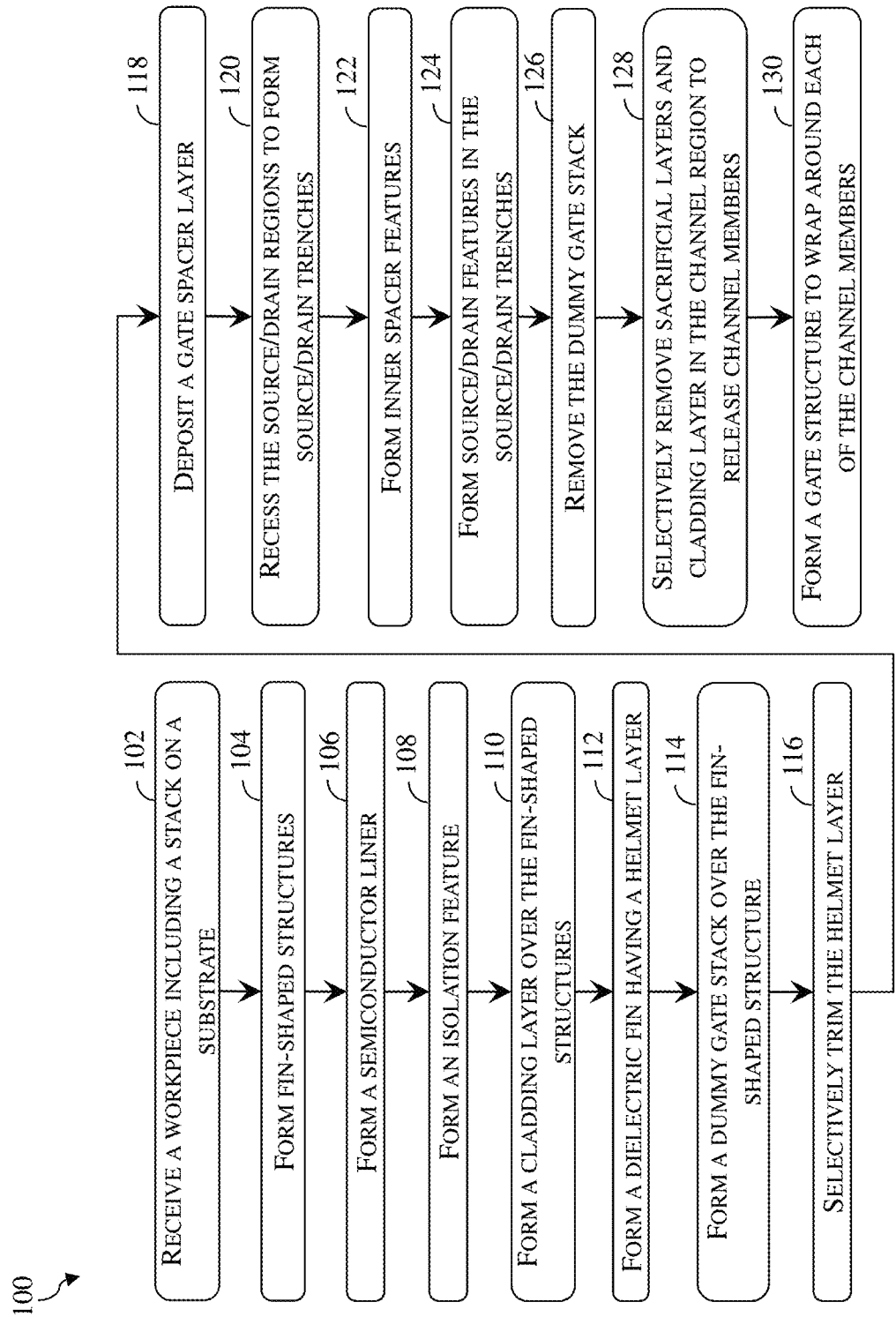
FIG. 1 illustrates a flowchart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is related to dielectric fins and formation of dielectric fins to prevent gate-source/drain shorts in an MBC transistor.

With respect to MBC transistors, dielectric fins may be formed to define and separate adjacent source/drain features. In some instances, a sacrificial cladding layer is deposited over fin-shaped structures that include alternating sacrificial layer and channel layers. The sacrificial cladding layer and the sacrificial layers in channel regions of the fin-shaped structures may be selectively removed later to release the channel layers as bridge-like channel members extending between source/drain features. When a sacrificial cladding layer is used, formation of source/drain openings also removes at least a portion of the sacrificial cladding layer in the source/drain region. In an ideal situation, the sacrificial cladding layer should be completely removed from the source/drain openings. However, the real-world situation is less than ideal. In examples where dielectric fins are thick and the fin-shaped structures are tapered, anisotropic etching of the source/drain regions may leave behind left-over sacrificial cladding layer near the bottom of the dielectric fins. When the materials for the inner spacer features are deposited and recessed, the leftover sacrificial cladding layer may prevent the inner spacer feature from reaching the desired thickness. It is observed that the reduced thickness of the inner spacer feature may cause shorting between the gate structure and the source/drain feature.

The present disclosure provides methods of trimming the dielectric fins after the formation of dummy gate stacks but before the deposition of a gate spacer layer over the dummy gate stacks. In some embodiments, each of the dielectric fins may include an outer layer, an inner layer disposed in the outer layer, and a helmet layer over the outer layer and the inner layer. The helmet layer may be formed of a high-k dielectric material, such as silicon nitride, silicon carbide, silicon carbonitride, silicon oxycarbonitride, aluminum oxide, aluminum nitride, aluminum oxynitride, zirconium oxide, zirconium nitride, zirconium aluminum oxide, or hafnium oxide. In some implementations, the trimming of the present disclosure selectively removes a portion of the helmet layer to improve the line-of-sight in the subsequent source/drain opening formation process. It is observed that the trimming of the helmet layer may reduce the amount of leftover sacrificial cladding layer, thereby reducing the gate-source/drain shorts.

The various aspects of the present disclosure will now be described in more detail with reference to the figures. FIG. 1 illustrates a flowchart of a method 100 of forming a semiconductor device. Method 100 is merely an example and is not intended to limit the present disclosure to what is explicitly illustrated in method 100. Additional steps may be provided before, during and after method 100, and some steps described can be replaced, eliminated, or moved around for additional embodiments of the methods. Not all steps are described herein in detail for reasons of simplicity. Method 100 is described below in conjunction with FIGS. 2-17, which illustrate fragmentary perspective or cross-sectional views of a workpiece 200 at different stages of fabrication according to embodiments of method 100. Because a semiconductor device will be formed from the workpiece 200, the workpiece 200 may be referred to as a semiconductor device 200 as the context requires. Throughout FIGS. 2-17, the X direction, the Y direction, and the Z direction are perpendicular to one another and are used consistently. For example, the X direction in one figure is parallel to the X direction in a different figure. Additionally, throughout the present disclosure, like reference numerals are used to denote like features.

Figure 2:
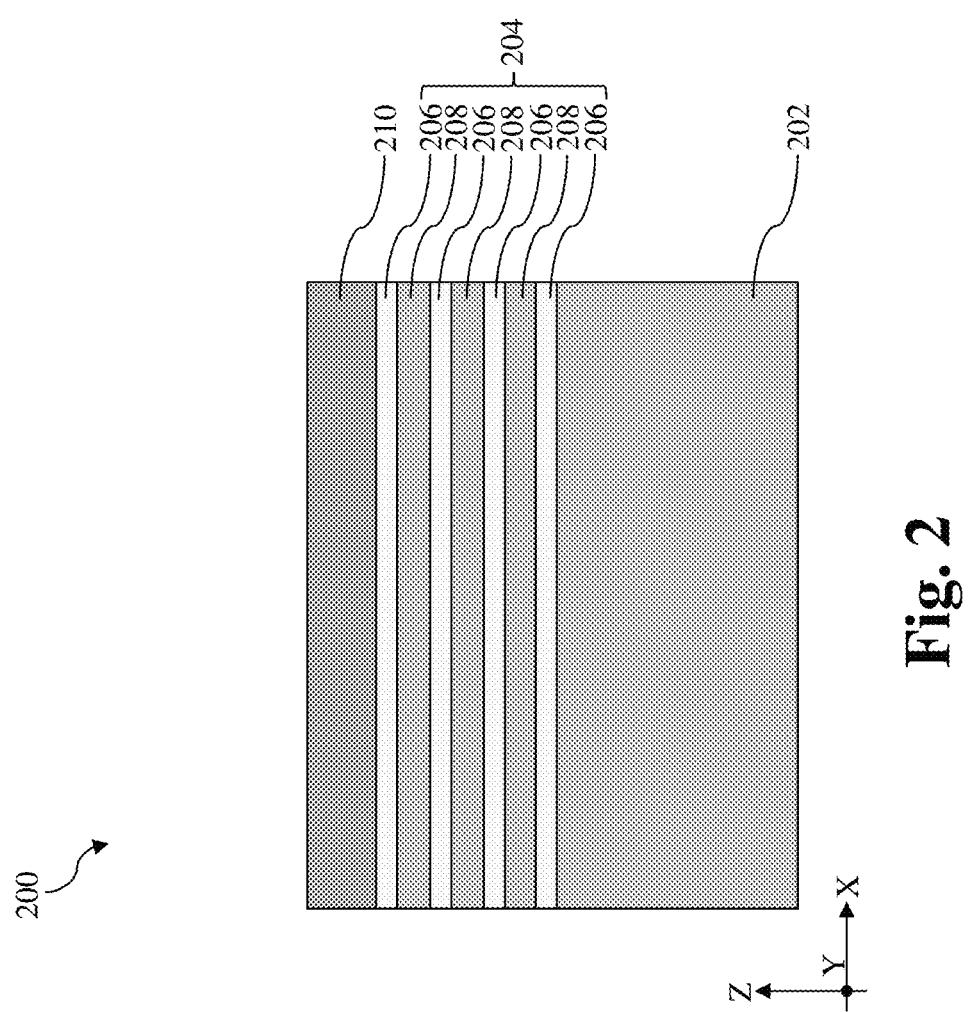
FIGS. 2-17 illustrate fragmentary cross-sectional and perspective views of a workpiece during various fabrication stages in the method of FIG. 1, according to one or more aspects of the present disclosure.

Referring to FIGS. 1 and 2, method 100 includes a block 102 where a workpiece 200 is received. As shown in FIG. 2, the workpiece 200 includes a substrate 202 and a stack 204 disposed on the substrate 202. In one embodiment, the substrate 202 may be a silicon (Si) substrate. In some other embodiments, the substrate 202 may include other semiconductor materials such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure or a germanium-on-insulator (GeOI) structure. In some embodiments, the substrate 202 may include one or more well regions, such as n-type well regions doped with an n-type dopant (i.e., phosphorus (P) or arsenic (As)) or p-type well regions doped with a p-type dopant (i.e., boron (B)), for forming different types of devices. The doping the n-type wells and the p-type wells may be formed using ion implantation or thermal diffusion.

Referring still to FIG. 2, the stack 204 may include a plurality of channel layers 208 interleaved by a plurality of sacrificial layers 206. The channel layers 208 and the sacrificial layers 206 may have different semiconductor compositions. In some implementations, the channel layers 208 are formed of silicon (Si) and sacrificial layers 206 are formed of silicon germanium (SiGe). In these implementations, the additional germanium content in the sacrificial layers 206 allow selective removal or recess of the sacrificial layers 206 without substantial damages to the channel layers 208. In some embodiments, the sacrificial layers 206 and channel layers 208 may be deposited using an epitaxial process. The stack 204 may be epitaxially deposited using CVD deposition techniques (e.g., vapor-phase epitaxy (VPE) and/or ultra-high vacuum CVD (UHV-CVD)), molecular beam epitaxy (MBE), and/or other suitable processes. The sacrificial layers 206 and the channel layers 208 are deposited alternatingly, one-after-another, to form the stack 204. It is noted that four (4) layers of the sacrificial layers 206 and three (3) layers of the channel layers 208 are alternately and vertically arranged as illustrated in FIG. 2, which is for illustrative purposes only and not intended to be limiting beyond what is specifically recited in the claims. The number of layers depends on the desired number of channels members for the semiconductor device 200. In some embodiments, the number of the channel layers 208 is between 2 and 10.

To prepare for the subsequent patterning process, a hard mask layer 210 is deposited over the stack 204. The hard mask layer 210 serves as an etch mask to pattern the stack 204 and a portion of the substrate 202. In some embodiments, the hard mask layer 210 may be deposited using CVD, plasma-enhanced CVD (PECVD), atomic layer deposition (ALD), plasma-enhanced ALD (PEALD), or a suitable deposition method. The hard mask layer 210 may be a single layer or a multilayer. When the hard mask layer 210 is a multi-layer, it may include a first layer and a second layer disposed over the first layer. In one embodiment, the first layer may be a pad oxide and the second layer may be a pad nitride layer.

Figure 3:
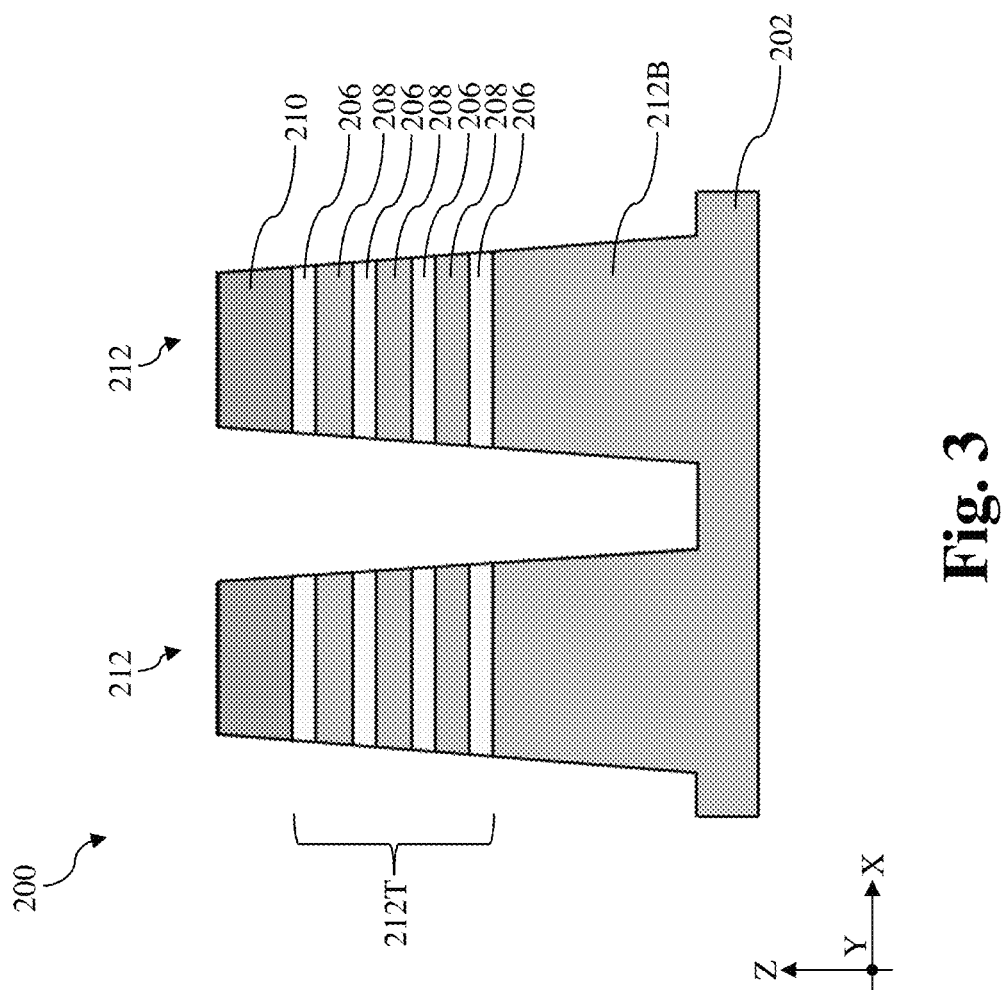

Referring to FIGS. 1 and 3, method 100 includes a block 104 where fin-shaped structures 212 are formed. In some embodiments, at block 104, the stack 204 and a portion of the substrate 202 are patterned to form the fin-shaped structures 212. As shown in FIG. 3, each of the fin-shaped structures 212 includes a base portion 212B formed from a portion of the substrate 202 and a top portion 212T formed from the stack 204. The top portion 212T is disposed over the base portion 212B. The fin-shaped structures 212 extend lengthwise along the Y direction and extend vertically along the Z direction from the substrate 202. The fin-shaped structures 212 may be patterned using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the hard mask layer 210 and then the patterned hard mask layer 210 may be used to pattern the fin-shaped structures 212 by etching the stack 204 and the substrate 202. The etching process can include dry etching, wet etching, reactive ion etching (RIE), and/or other suitable processes. While it is desirable to form fin-shaped structures 212 with perfectly vertical sidewalls, the fin-shaped structures 212 may have a taper profile, as representatively shown in FIG. 4. In the depicted embodiments, each of the fin-shaped structures 212 has a narrow top surface and a wider bottom surface and may be characterized by a taper angle between about 0° and about 5°.

Figure 4:
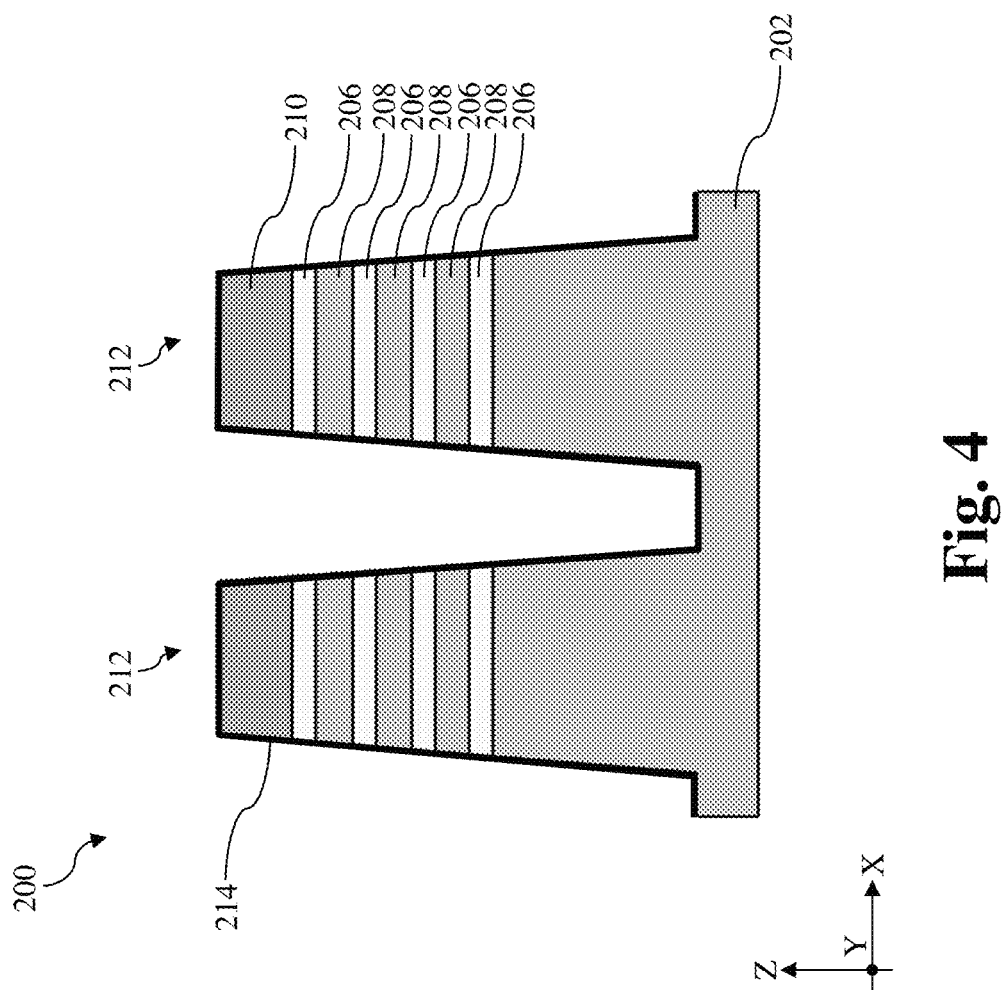

Referring to FIGS. 1 and 4, method 100 includes a block 106 where a semiconductor liner 214 is formed over the fin-shaped structures 212. In some embodiments, a semiconductor liner 214 may be deposited over the fin-shaped structures 212, as shown in FIG. 4. The semiconductor liner 214 may include silicon (Si) or silicon-rich silicon germanium (SiGe). In some implementations, the semiconductor liner 214 may be deposited using ALD, PEALD, VPE, MBE, or a suitable method. In some implementation where VPE or MBE are used, the process conditions are selected such that the deposition of the semiconductor liner 214 is not selective to surfaces of the fin-shaped structures 212 and the substrate 202. For example, the surfaces of the fin-shaped structures 212 may not be cleaned to remove surface oxides before the deposition of the semiconductor liner 214. In these implementations, the semiconductor liner 214 may be amorphous and may be deposited over top surfaces and sidewalls of the hard mask layer 210.

Figure 5:
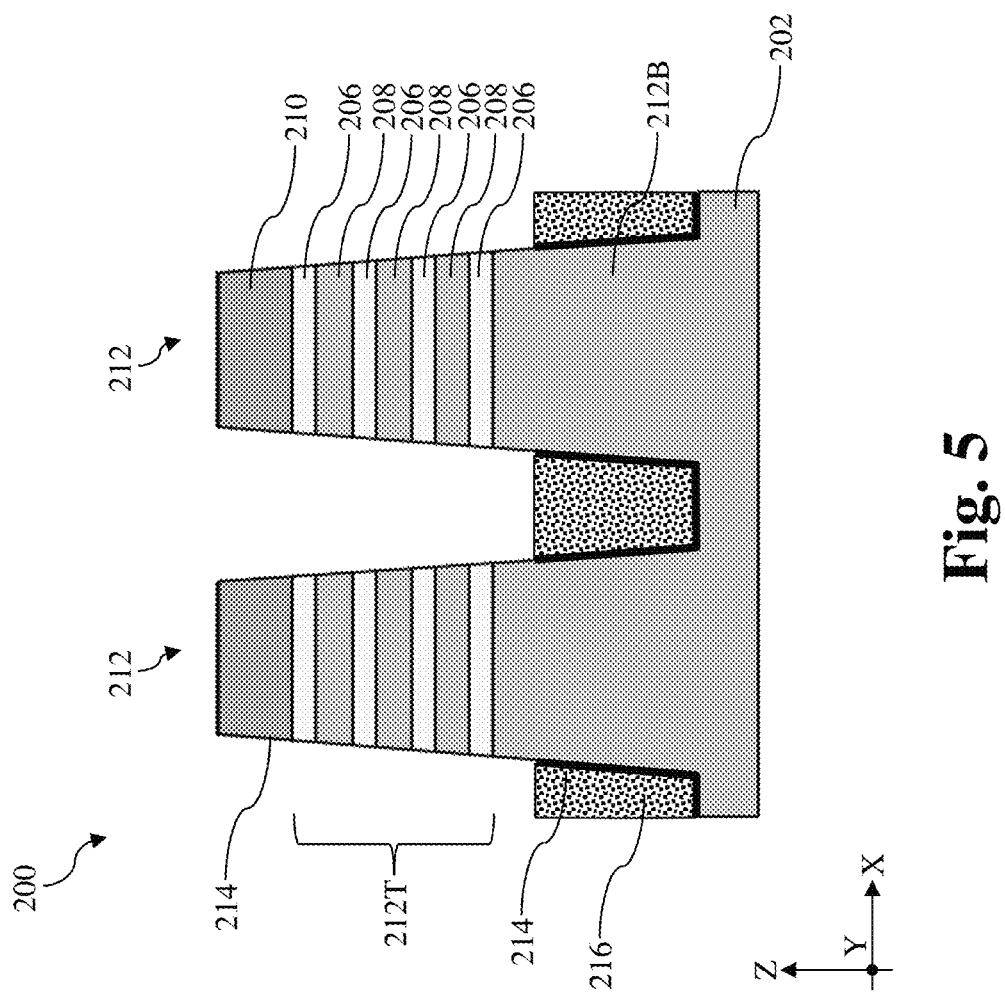

Referring to FIGS. 1 and 5, method 100 includes a block 108 where an isolation feature 216 is formed. After the fin-shaped structures 212 are formed, the isolation feature 216 shown in FIG. 5 is formed between neighboring fin-shaped structures 212. The isolation feature 216 may also be referred to as a shallow trench isolation (STI) feature 216. In an example process, a dielectric material for the isolation feature 216 is first deposited over the semiconductor liner 214 over the workpiece 200, filling the trenches between fin-shaped structures 212 with the dielectric material. In some embodiments, the dielectric material may include silicon oxide, silicon nitride, silicon oxynitride, fluorine-doped silicate glass (FSG), a low-k dielectric, combinations thereof, and/or other suitable materials. In various examples, the dielectric material may be deposited by a CVD process, a subatmospheric CVD (SACVD) process, a flowable CVD (FCVD) process, an ALD process, spin-on coating, and/or other suitable process. The deposited dielectric material is then thinned and planarized, for example by a chemical mechanical polishing (CMP) process, until at least a portion of the semiconductor liner 214 is exposed. The planarized dielectric material is further recessed or etched back by a dry etching process, a wet etching process, and/or a combination thereof to form the isolation feature 216. In embodiments illustrated in FIG. 5, the semiconductor liner 214 not covered by the isolation feature 216 may also be removed from the surfaces of the fin-shaped structures 212 in the etch-back process. As shown in FIG. 5, the top portions 212T of the fin-shaped structures 212 rise above the isolation feature 216 while the base portions 212B are surrounded by the isolation feature 216.

Figure 6:
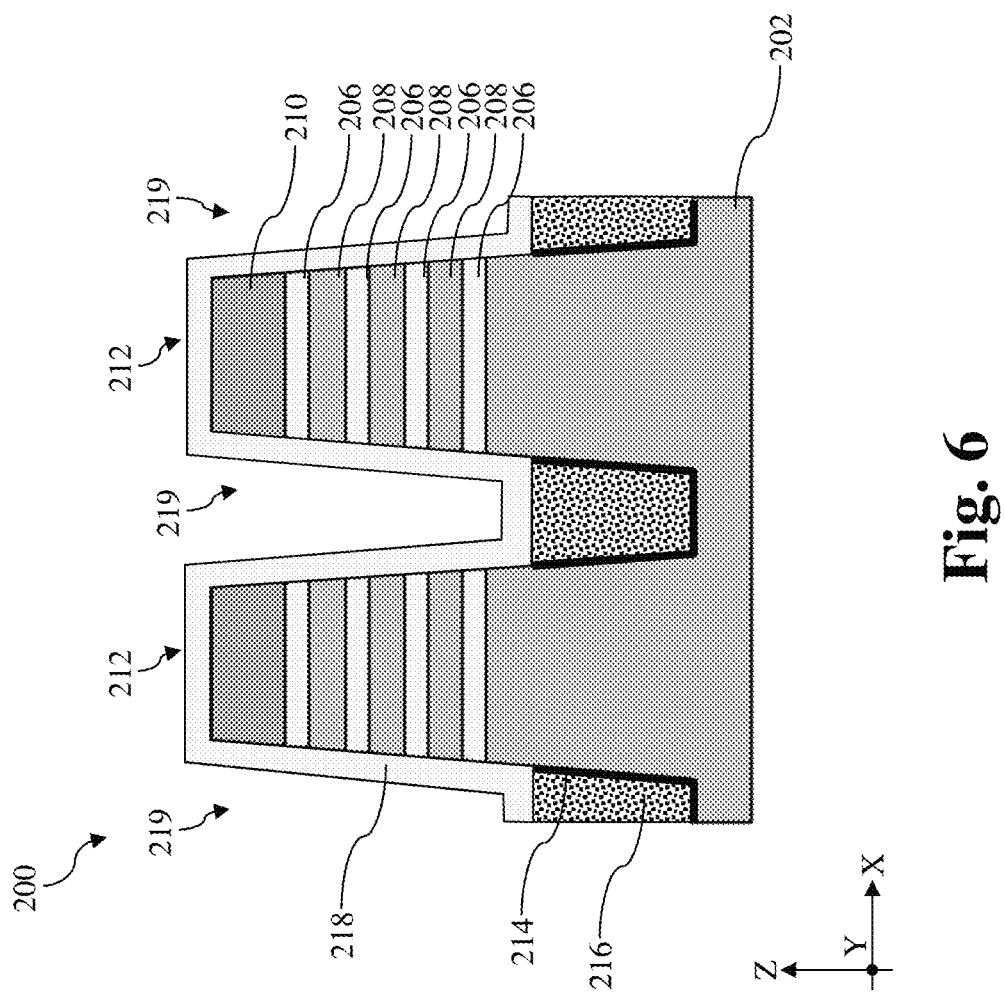
Figure 7:
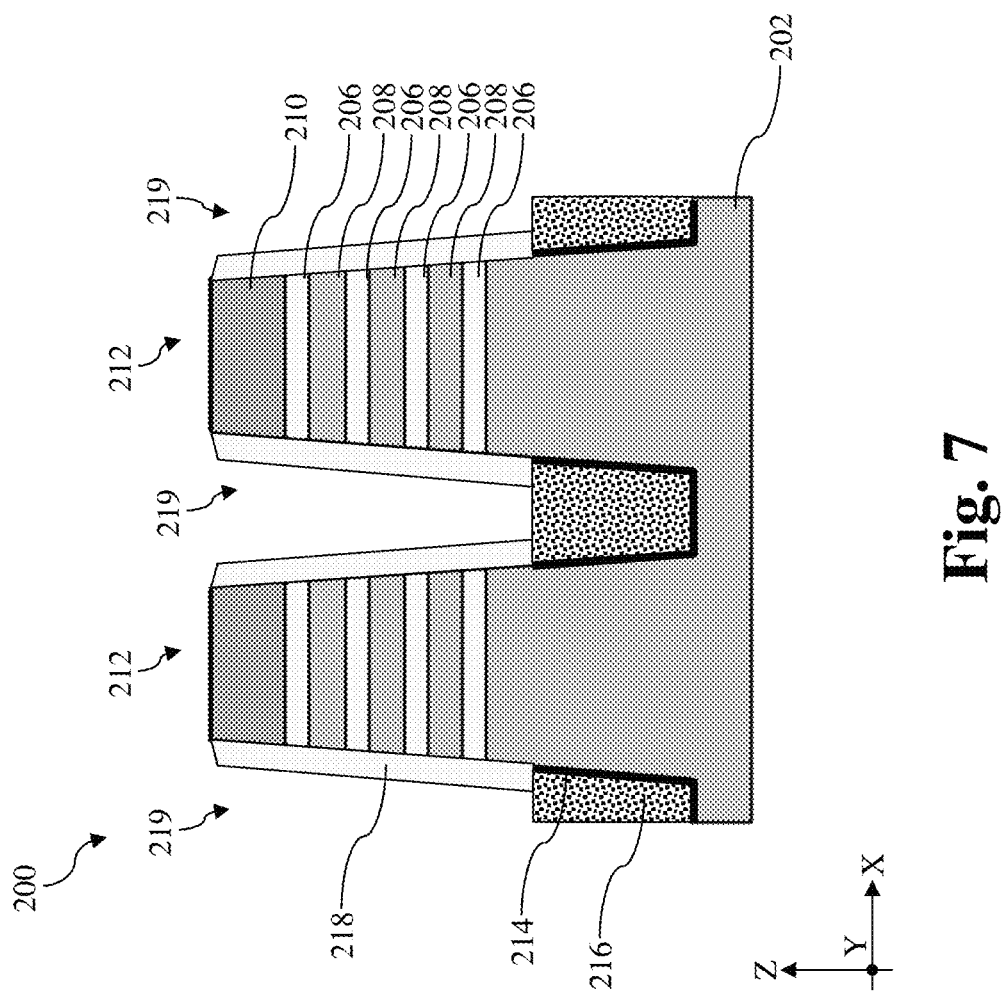

Referring to FIGS. 1, 6 and 7, method 100 includes a block 110 where a cladding layer 218 is formed over the fin-shaped structures 212. In some embodiments, the cladding layer 218 may have a composition similar to that of the sacrificial layers 206. In one example, the cladding layer 218 may be formed of silicon germanium (SiGe). This common composition allows selective removal of the sacrificial layers 206 and the cladding layer 218 in a subsequent process. In some embodiments, the cladding layer 218 may be conformally and epitaxially grown using vapor phase epitaxy (VPE) or molecular beam epitaxy (MBE). As shown in FIG. 6, the deposition process of the cladding layer 218 is selected that the cladding layer 218 is amorphous and is conformally deposited on the surfaces of the workpiece 200, including surfaces of the fin-shaped structures 212 and the isolation feature 216. In some instances, the cladding layer 218 may have a thickness between about 5 nm and about 10 nm. After the deposition of the cladding layer 218, adjacent sidewalls of the cladding layer 218 may define a trench 219.

Reference is now made to FIG. 7. At block 110, after the cladding layer 218 is deposited over the workpiece 200, the workpiece 200 is subject to an etch back process to recess the cladding layer 218 until the cladding layer 218 on the top-facing surfaces are removed. As shown in FIG. 7, top surfaces of the hard mask layer 210 and the isolation feature 216 may be exposed in the trench 219 after the etch back process.

Figure 8:
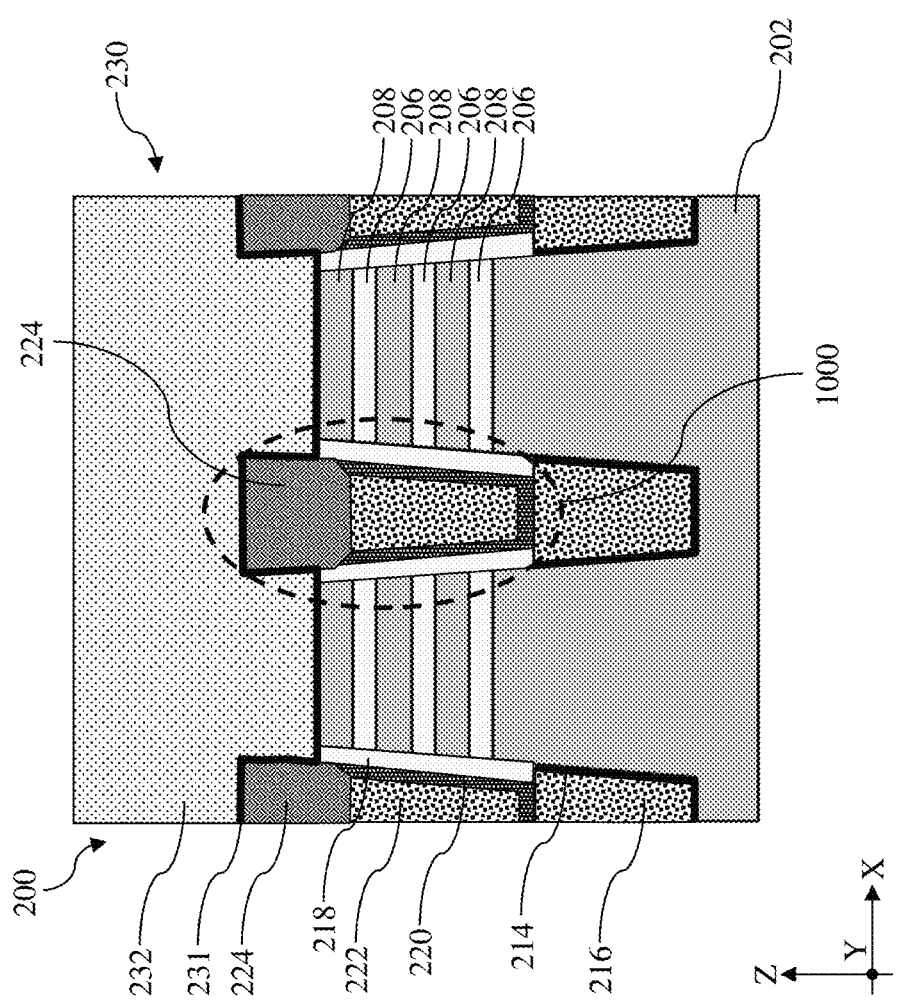

Referring to FIGS. 1 and 8, method 100 includes a block 112 where a dielectric fin 1000 that includes a helmet layer 224 is formed. At block 112, dielectric fins 1000 are formed into the trenches 219 (shown in FIG. 7). In the depicted embodiments, each of the dielectric fins 1000 includes multiple layers. In an example process, a liner 220 is conformally deposited over the workpiece 200, including in the trenches 219, as shown in FIG. 7. The liner 220 may be deposited using PECVD, ALD, or a suitable method. The liner 220 lines the sidewalls and the bottom surfaces of the trenches 219. A filler layer 222 is then deposited over the liner 220 on the workpiece 200 using CVD, SACVD, FCVD, ALD, spin-on coating, and/or other suitable process. In some instances, a dielectric constant of the liner 220 is greater than that of the filler layer 222. The liner 220 may include silicon, silicon nitride, silicon carbide, silicon carbonitride, silicon oxycarbonitride, aluminum oxide, aluminum nitride, aluminum oxynitride, zirconium oxide, zirconium nitride, zirconium aluminum oxide, hafnium oxide, or a suitable dielectric material. The filler layer 222 may include silicon oxide, silicon carbide, silicon oxynitride, silicon oxycarbonitride, or a suitable dielectric material. After the deposition of the liner 220 and the filler layer 222, the workpiece 200 is planarized using a planarization process, such as a chemical mechanical polishing (CMP) process, until the liner 220 and the filler layer 222 over the cladding layer 218 are removed. After the planarization, the filler layer 222 and a portion of the liner 220 are selectively and partially recessed and a helmet layer 224 is then deposited over the workpiece 200. The helmet layer 224 may include silicon nitride, silicon carbide, silicon carbonitride, silicon oxycarbonitride, aluminum oxide, aluminum nitride, aluminum oxynitride, zirconium oxide, zirconium nitride, zirconium aluminum oxide, hafnium oxide, or a suitable dielectric material. The workpiece 200 is then planarized again using a CMP process to remove excess helmet layer 224 on the cladding layer 218. At this point, the dielectric fins 1000 are substantially formed. Each of the dielectric fins 1000 includes a helmet layer 224 disposed over the filler layer 222 and the liner 220. In one embodiment, the liner 220 include silicon nitride or silicon carbonitride the filler layer 222 includes silicon oxide, and the helmet layer 224 includes silicon carbonitride, silicon nitride, aluminum oxide, aluminum nitride, aluminum oxynitride, zirconium oxide, zirconium nitride, zirconium aluminum oxide, or hafnium oxide.

After the formation of the dielectric fins 1000, the workpiece 200 is anisotropically etched to selectively remove a portion of the cladding layer 218, a portion of the semiconductor liner 214, the hard mask layer 210, and the topmost sacrificial layer 206 to expose the topmost channel layers 208, without substantially damaging the helmet layer 224. The anisotropic etch process may include a single stage etch process or a multi-stage etch process. When the anisotropic etch process is single-stage, it is selective to semiconductor materials (e.g. silicon and silicon germanium) and silicon nitride. When the anisotropic etch process is multi-stage, the first stage may be selective to semiconductor materials (e.g. silicon and silicon germanium) and the second stage may be selective to silicon nitride. In some implementations, the anisotropic etch process may include hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$ and/or $BCl_3$), a bromine-containing gas (e.g., HBr and/or $CHBr_3$), an iodine-containing gas, other suitable gases and/or plasmas, and/or combinations thereof.

Referring to FIGS. 1 and 8, method 100 includes a block 114 where a dummy gate stack 230 is formed over the fin-shaped structures 212. In some embodiments, a gate replacement process (or gate-last process) is adopted where the dummy gate stack 230 serves as a placeholder for a functional gate structure. Other processes and configuration are possible. As shown in FIG. 7, the dummy gate stack 230 includes a dummy dielectric layer 231, a dummy electrode 232 disposed over the dummy dielectric layer 231. The regions of the fin-shaped structures 212 underlying the dummy gate stack 230 may be referred to as channel regions. Each of the channel regions in a fin-shaped structure 212 is sandwiched between two source/drain regions for source/drain formation. In an example process, the dummy dielectric layer 231 is blanketly deposited over the workpiece 200 by CVD. A material layer for the dummy electrode 232 is then blanketly deposited over the dummy dielectric layer 231. The dummy dielectric layer 231 and the material layer for the dummy electrode 232 are then patterned using photolithography processes to form the dummy gate stack 230. In some embodiments, the dummy dielectric layer 231 may include silicon oxide and the dummy electrode 232 may include polycrystalline silicon (polysilicon).

Figure 9:
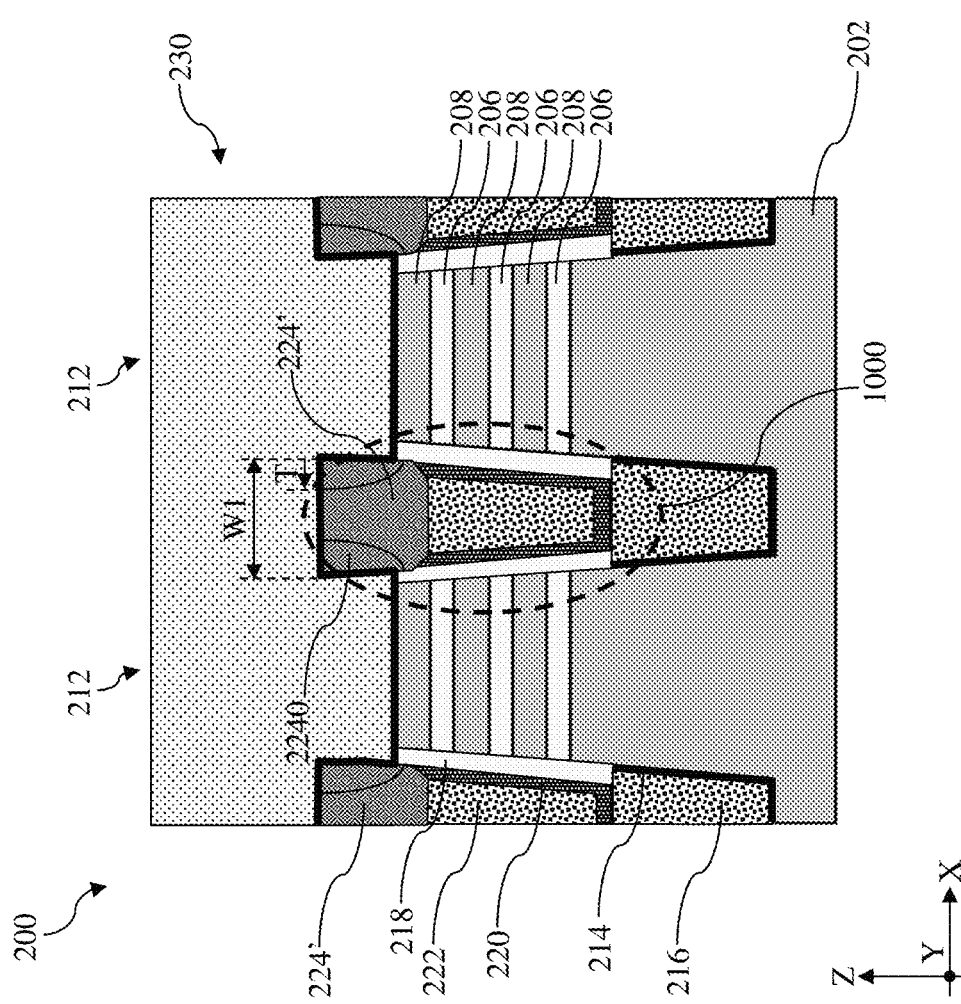

Referring to FIGS. 1 and 9, method 100 includes a block 116 where the helmet layer 224 is selectively trimmed. As shown in FIG. 8, the trimming at block 116 may trim the portion of the helmet layer 224 that is not covered by the dummy gate stack 230 to form trimmed helmet layer 224'. The trimming at block 116 may be performed using dry etching, wet etching, or a combination thereof. In some embodiments, because the goal is not to reduce the height of the helmet layer 224 along the Z direction but to reduce its width along the X direction, the trimming may include use of slanted plasma where a substrate holder to which the workpiece 200 is mounted is tilted at an angle. To achieve the shape of the trimmed helmet layer 224', the substrate holder may first be tilted clockwise at an angle and then tilted counter clockwise at the same angle. The chemistry of the slanted plasma etching may be selective to the material of the helmet layer 224. For example, when the helmet layer 224 is formed of silicon nitride, the trimming may include use of nitrogen, oxygen, a fluorine-containing gas (e.g., $CF_4$, $SF_6$, $CH_2F_2$, $CHF_3$, and/or $C_2F_6$), a chlorine-containing gas (e.g., $BCl_3$), and a carbon containing gas (e.g., $CH_4$). In one embodiment, the trimming may include use of boron trichloride ($BCl_3$). At block 116, the helmet layer 224 covered by the dummy gate stack 230 is not trimmed.

In embodiments represented in FIG. 9, a top surface of the helmet layer 224 may have a first width W1 along the X direction before the trimming. The trimming at block 116 may remove a portion 2240 from the uncovered portion of the helmet layer 224 and reduce the first width W1 by 2 times a thickness T of the portion 2240 (i.e., 2T). As will be described below, at least one gate spacer 234 will be deposited over the workpiece 200, including over the sidewalls of the trimmed helmet layer 224'. Without trimming of the helmet layer 224 in the source/drain region to reduce its width by 2T, the at least one gate spacer 234 will substantially extend over the cladding layer 218, thereby hindering the line-of-sight for anisotropically etching the cladding layer 218 at block 120. In some embodiments, the first width W1 is between about 8 nm and about 15 nm and the thickness T is between about 2 nm and about 5 nm. In these embodiments, the second width W2 may be between about 5 nm and about 10 nm.

Figure 10:
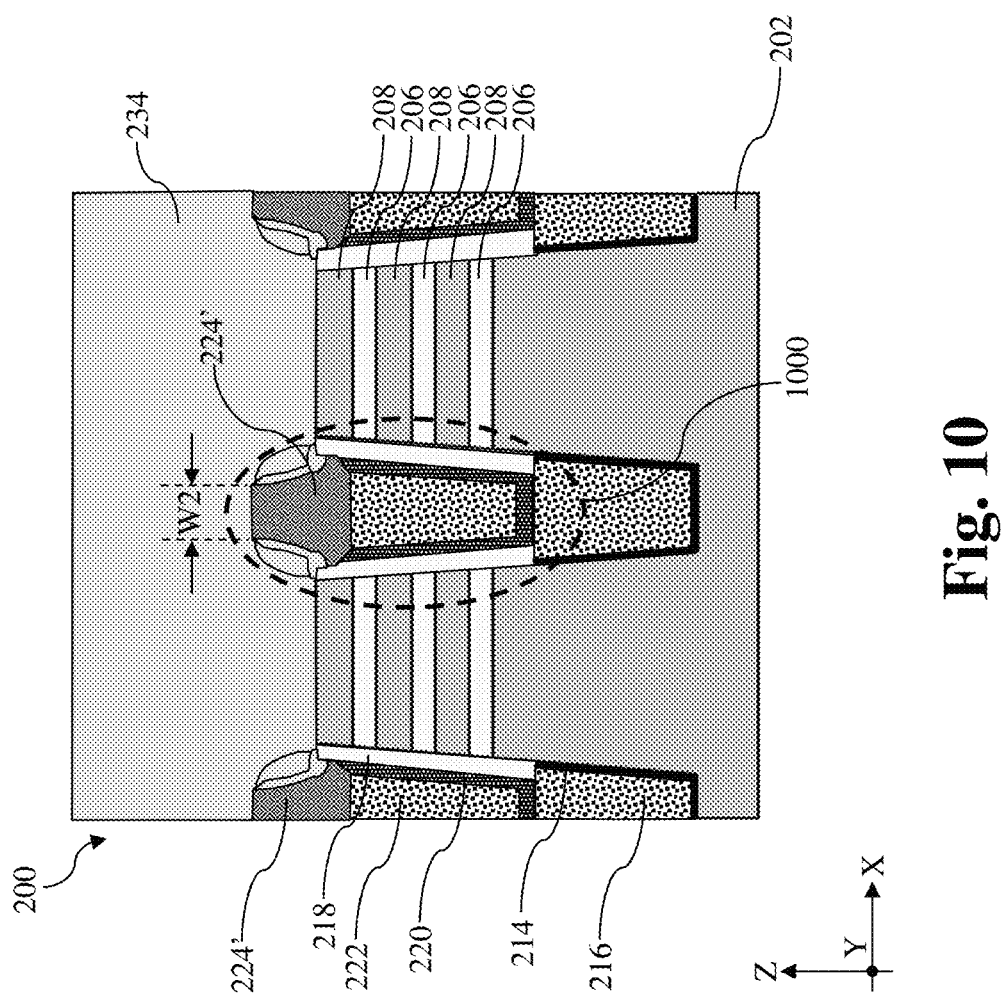

Referring to FIGS. 1 and 10, method 100 includes a block 118 where at least one gate spacer 234 is formed along sidewalls of the dummy gate stack 230. The at least one gate spacer 234 may include two or more gate spacer layers. Dielectric materials for the at least one gate spacer 234 may be selected to allow selective removal of the dummy gate stack 230 without substantially damaging the at least one gate spacer 234. Suitable dielectric materials may include silicon nitride, silicon oxycarbonitride, silicon carbonitride, silicon oxide, silicon oxycarbide, silicon carbide, silicon oxynitride, and/or combinations thereof. In an example process, the at least one gate spacer 234 may be conformally deposited over the workpiece 200 using CVD, subatmospheric CVD (SACVD), or ALD. In one embodiments, the at least one gate spacer 234 includes two gate spacers, one formed of silicon nitride and the other formed of silicon carbonitride. Other combinations are fully envisioned. After the deposition of the at least one gate spacer 234, the at least one gate spacer 234 is etched back to expose the top surfaces of the fin-shaped structures 212 in the source/drain regions. As shown in FIG. 10, due to the trimming at block 116 to reduce the width of the helmet layer 224, after the etch back, the at least one gate spacer 234 only partially covers the cladding layer 218, leaving a portion of the top surface of the cladding layer 218 exposed. Because the top surface of the cladding layer 218 is not completely covered, the cladding layer 218 may be more completely removed.

Figure 11:
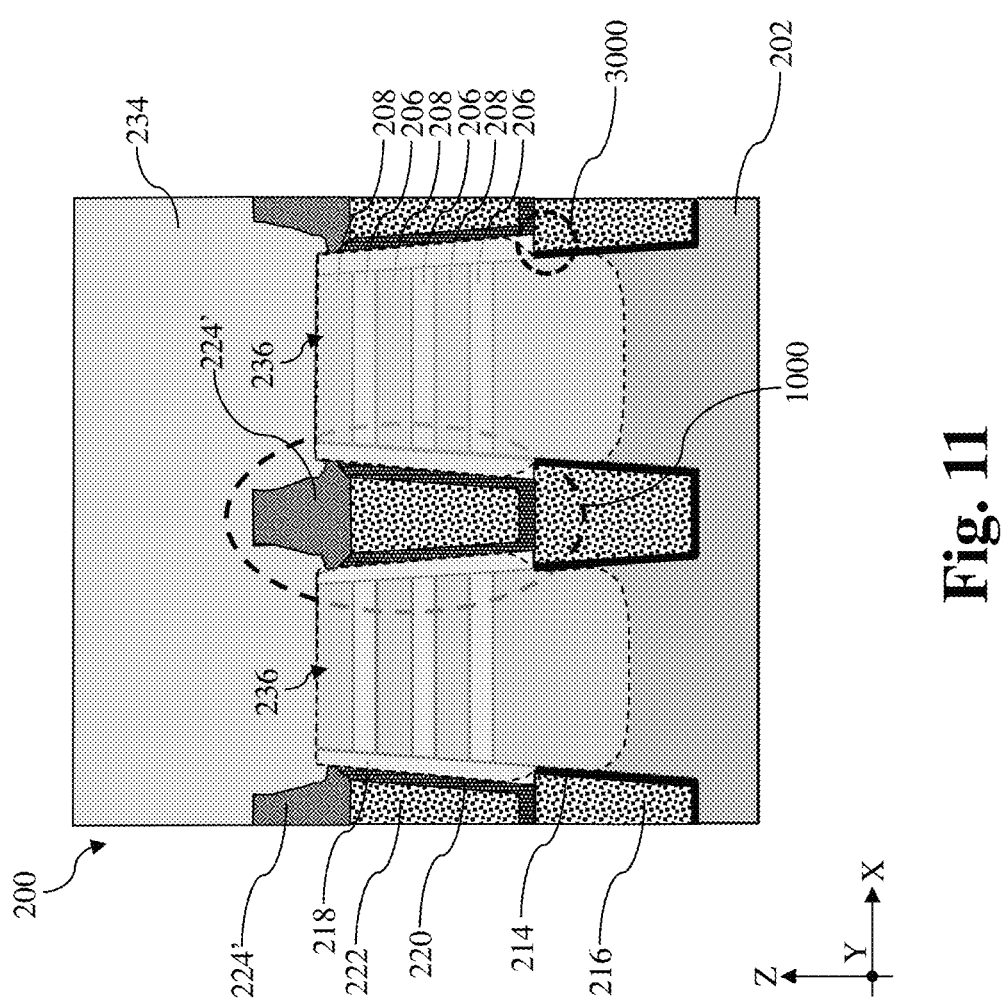
Figure 12:
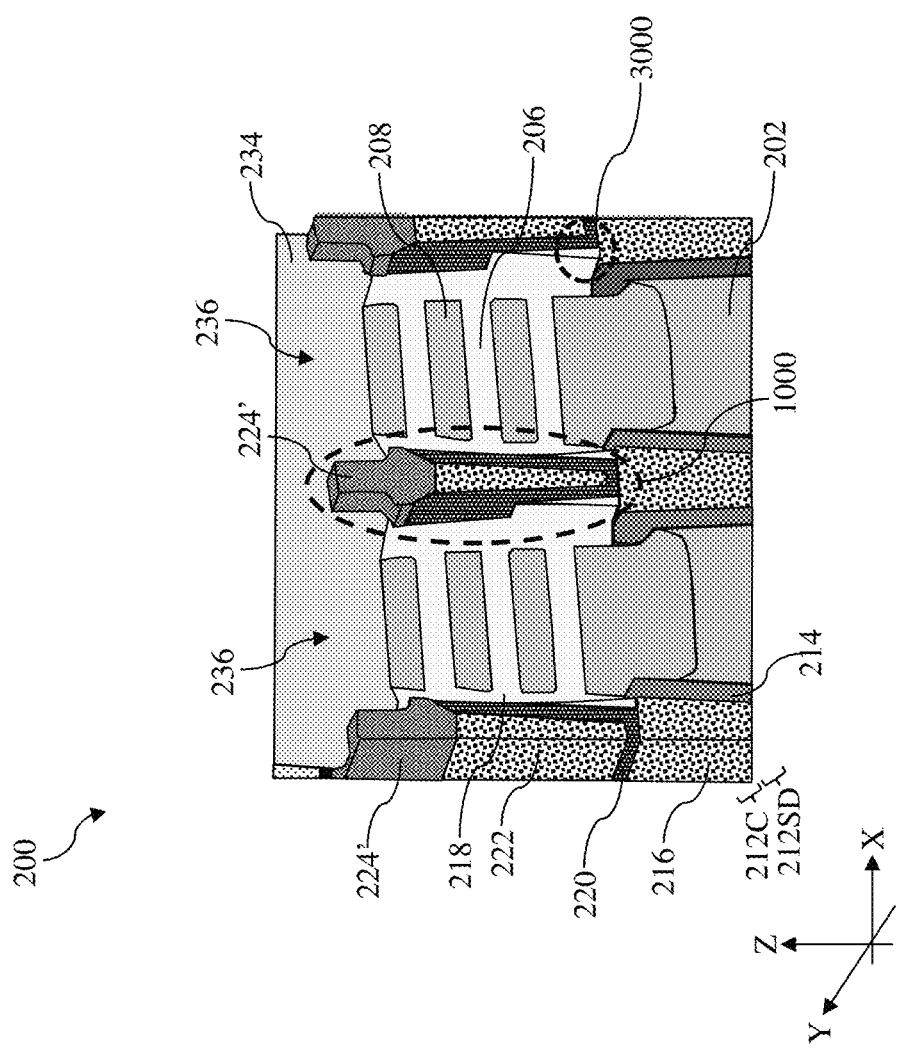

Referring to FIGS. 1, 11 and 12, method 100 includes a block 120 where the source/drain regions of the fin-shaped structures 212 are recessed to form source/drain trenches 236. Among the figures being referred to in conjunction with block 120, FIG. 11 illustrates a fragmentary cross-sectional view and FIG. 12 illustrates a fragmentary perspective view of the same area shown in FIG. 11. The perspective view in FIG. 12 allows labeling of the source/drain region 212SD and the channel region 212C and helps to show where the source/drain trenches 236 are formed in the source/drain regions 212SD while the channel region 212C is covered by the dummy gate stack 230 and the at least one gate spacer 234. With the dummy gate stack 230 and the at least one gate spacer 234 serving as an etch mask, the workpiece 200 is anisotropically etched to form the source/drain trenches 236 over the source/drain regions 212SD of the fin-shaped structures 212. In some embodiments as illustrated in FIGS. 11 and 12, operations at block 120 may substantially remove the top portions 212T of fin-shaped structures 212 in the source/drain regions 212SD. In some other alternative embodiments, the source/drain trenches 236 may extend into the base portions 212B, which is formed from the substrate 202. The anisotropic etch at block 120 may include a dry etch process or a suitable etch process. For example, the dry etch process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. As shown in FIGS. 11 and 12, the dry etch process at block 120 may etch the helmet layer 224 and the liner 220 at a slower rate and leave some substantially unetched. Sidewalls of the plurality of channel layers 208, the plurality of the sacrificial layers 206, and the cladding layer 218 are exposed in the source/drain trenches 236.

In some implementations, the trimmed helmet layer 224' and its smaller second width W2 may improve line-of-sight of the etch process at block 120 to more completely remove the cladding layer 218 in the source/drain trenches 236. As representatively shown in FIGS. 11 and 12, despite the smaller second width W2 of the trimmed helmet layer 224', the bottom portion 3000 of the cladding layer 218 may remain at or around the junction or interface between the dielectric fin 1000 and the isolation feature 216. More specifically, the bottom portion 3000 of the cladding layer 218 may remain at or around the corner region defined by the liner 220 and the isolation feature 216.

Figure 13:
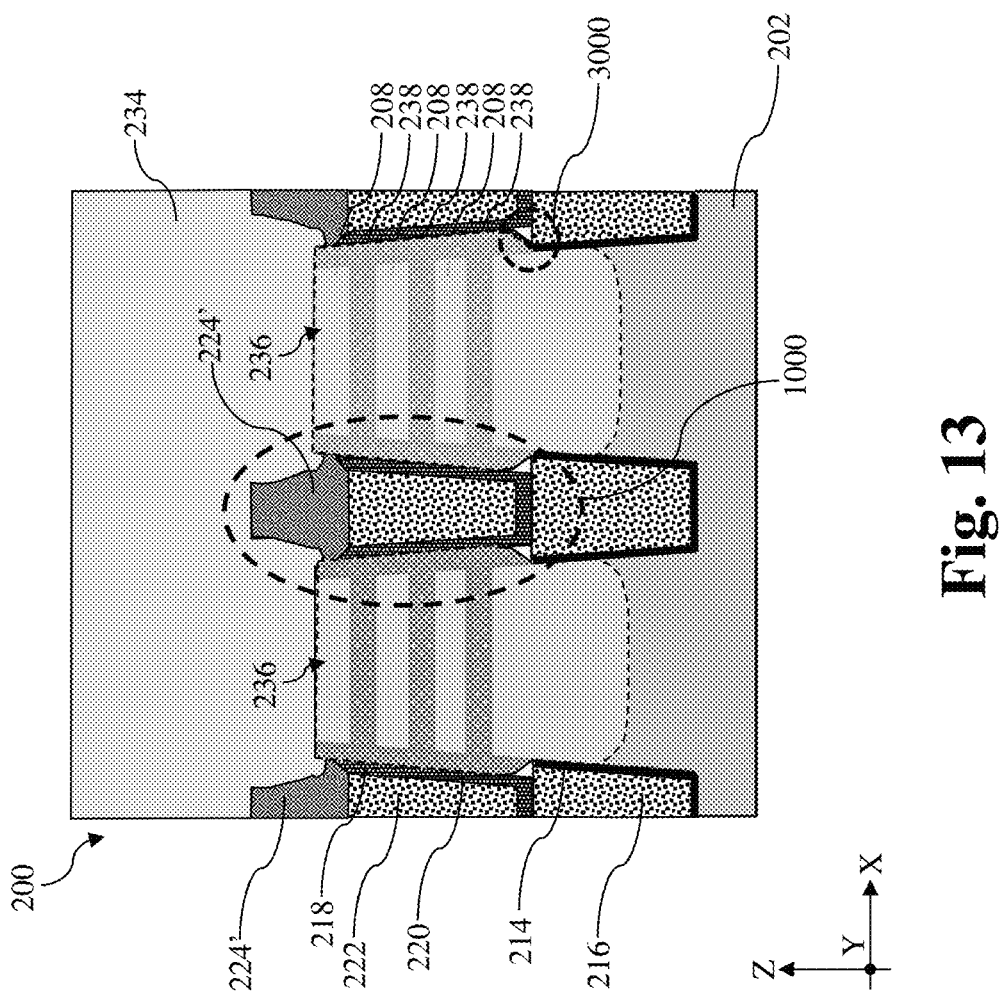

Referring to FIGS. 1 and 13, method 100 includes a block 122 where inner spacer features 238 are formed. Referring to FIG. 11, at block 122, the sacrificial layers 206 exposed in the source/drain trenches 236 are first selectively and partially recessed to form inner spacer recesses, while the exposed channel layers 208 are substantially unetched. Because the cladding layer 218 and the sacrificial layers 206 share a similar composition, the cladding layer 218 may be etched at block 122 as well. In an embodiment where the channel layers 208 consist essentially of silicon (Si), sacrificial layers 206 consist essentially of silicon germanium (SiGe), and the cladding layer 218 consists essentially of silicon germanium (SiGe), the selective and partial recess of the sacrificial layers 206 and the cladding layer 218 may include a SiGe oxidation process followed by a SiGe oxide removal. In that embodiments, the SiGe oxidation process may include use of ozone. In some other embodiments, the selective recess may include a selective isotropic etching process (e.g., a selective dry etching process or a selective wet etching process), and the extent at which the sacrificial layers 206 and the cladding layer 218 are recessed is controlled by duration of the etching process. The selective dry etching process may include use of one or more fluorine-based etchants, such as fluorine gas or hydrofluorocarbons. The selective wet etching process may include APM etch (e.g., ammonia hydroxide-hydrogen peroxide-water mixture). After the formation of the inner spacer recesses, an inner spacer material layer is then conformally deposited using CVD or ALD over the workpiece 200, including over and into the inner spacer recesses and the space left behind by the removed portion of the cladding layer 218. The inner spacer material may include silicon nitride, silicon oxycarbonitride, silicon carbonitride, silicon oxide, silicon oxycarbide, silicon carbide, or silico oxynitride. After the deposition of the inner spacer material layer, the inner spacer material layer is etched back to form inner spacer features 238, as illustrated in FIG. 13. It is noted that the bottom portion 3000 may also be etched at block 122. In some instances, at least a portion of the bottom portion 3000 may remain, as shown in FIG. 13. It is observed the thickness of the bottom portion 3000 is inversely related to the thickness of the inner spacer feature 238 near the bottom of the dielectric fin 1000. This is because the bottom portion 3000 may hinder the selective recess of the cladding layer 218. The selective trimming at block 116 reduces the thickness of the bottom portion 3000 and lead to a thicker inner spacer feature 238. A thicker inner spacer feature 238 may prevent shorts between the gate structure and the source/drain feature. Such shorts may be a result of etched-through inner spacer feature 238 during release of the channel members.

Figure 14:
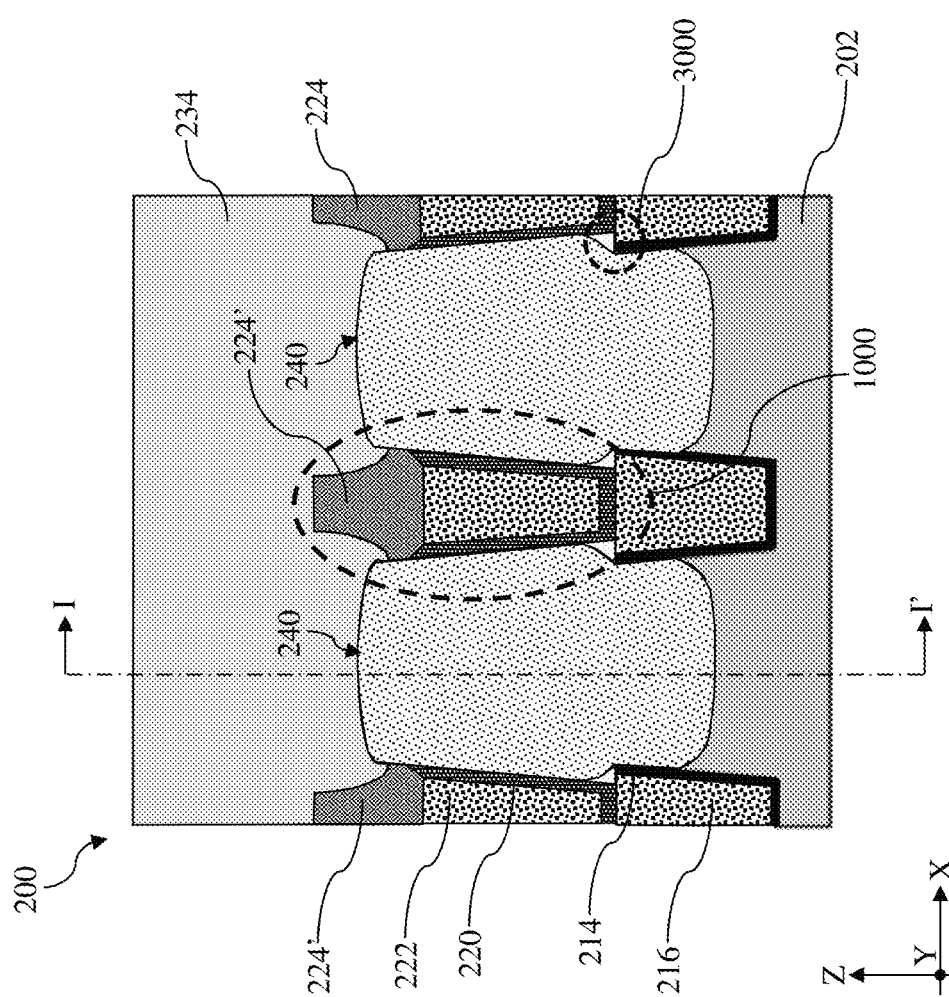

Referring to FIGS. 1 and 14, method 100 includes a block 124 where source/drain features 240 are formed in the source/drain trenches 236. The source/drain features 240 are selectively and epitaxially deposited on the exposed semiconductor surfaces of the channel layers 208 and the substrate 202. The source/drain features 240 may be deposited using an epitaxial process, such as vapor-phase epitaxy (VPE), ultra-high vacuum CVD (UHV-CVD), molecular beam epitaxy (MBE), and/or other suitable processes. The source/drain features 240 may be either n-type or p-type. When the source/drain features 240 are n-type, it may include silicon (Si) and may be doped with an n-type dopant, such as phosphorus (P) or arsenic (As). When the source/drain features 240 are p-type, it may include silicon germanium (SiGe) or germanium (Ge) and may be doped with a p-type dopant, such as boron (B) or gallium (Ga). Doping of the source/drain features 240 may be performed either in situ with their deposition or ex situ using an implantation process, such as a junction implant process. While not explicitly shown in the figures, the source/drain features 240 may include a first epitaxial layer and a second epitaxial layer disposed on the first epitaxial layer. In some instances, the first epitaxial layer and the second epitaxial layer may be doped with the same dopant species. In some alternative implementations, the first epitaxial layer and the second epitaxial layer may be doped with different dopant species. The second epitaxial layer may include a greater doping concentration than the first epitaxial layer to lower contact resistance. While the source/drain features 240 are not epitaxially grown from surfaces of the inner spacer features 238 and the liner 220, overgrowth of the source/drain features 240 may cover and come in contact with surfaces of the inner spacer features 238 and the liner 220. The source/drain features 240 are disposed in source/drain regions adjacent the channel region below the dummy gate stack 230.

Figure 15:
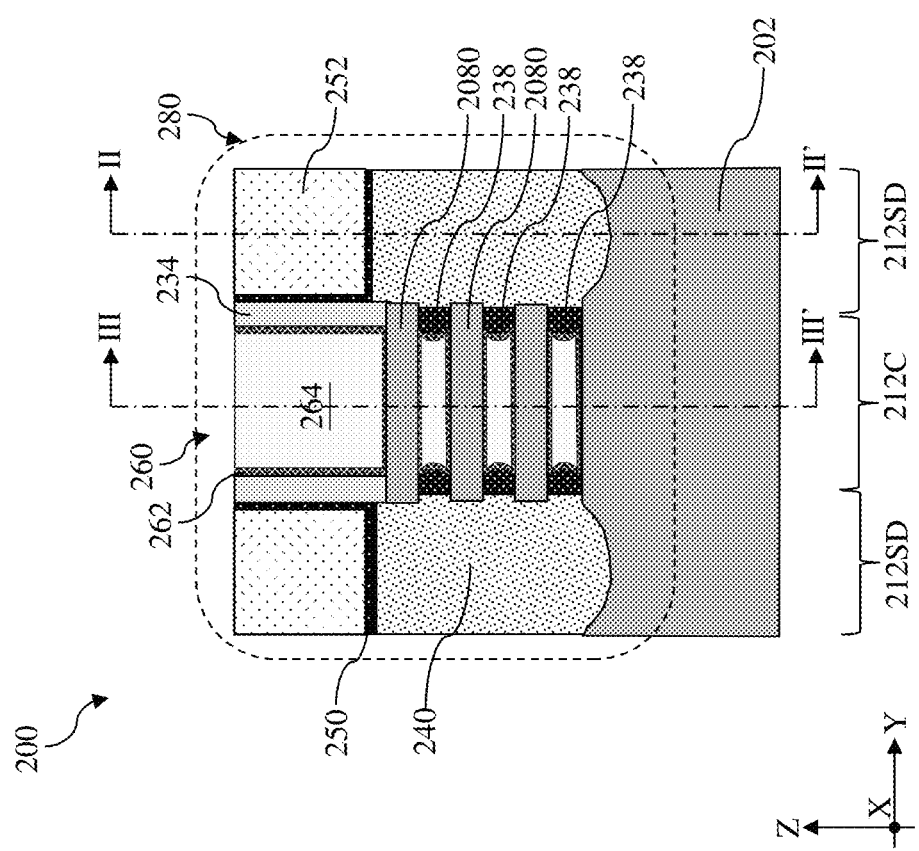
Figure 16:
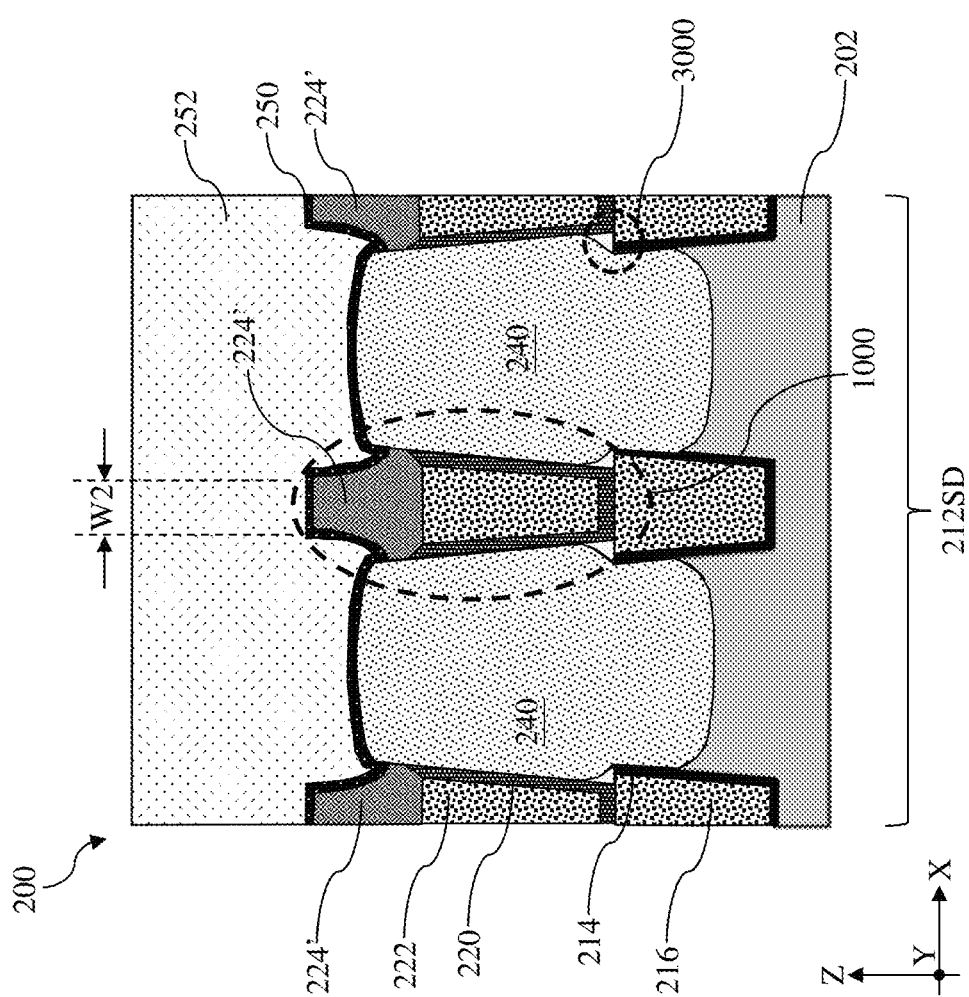
Figure 17:
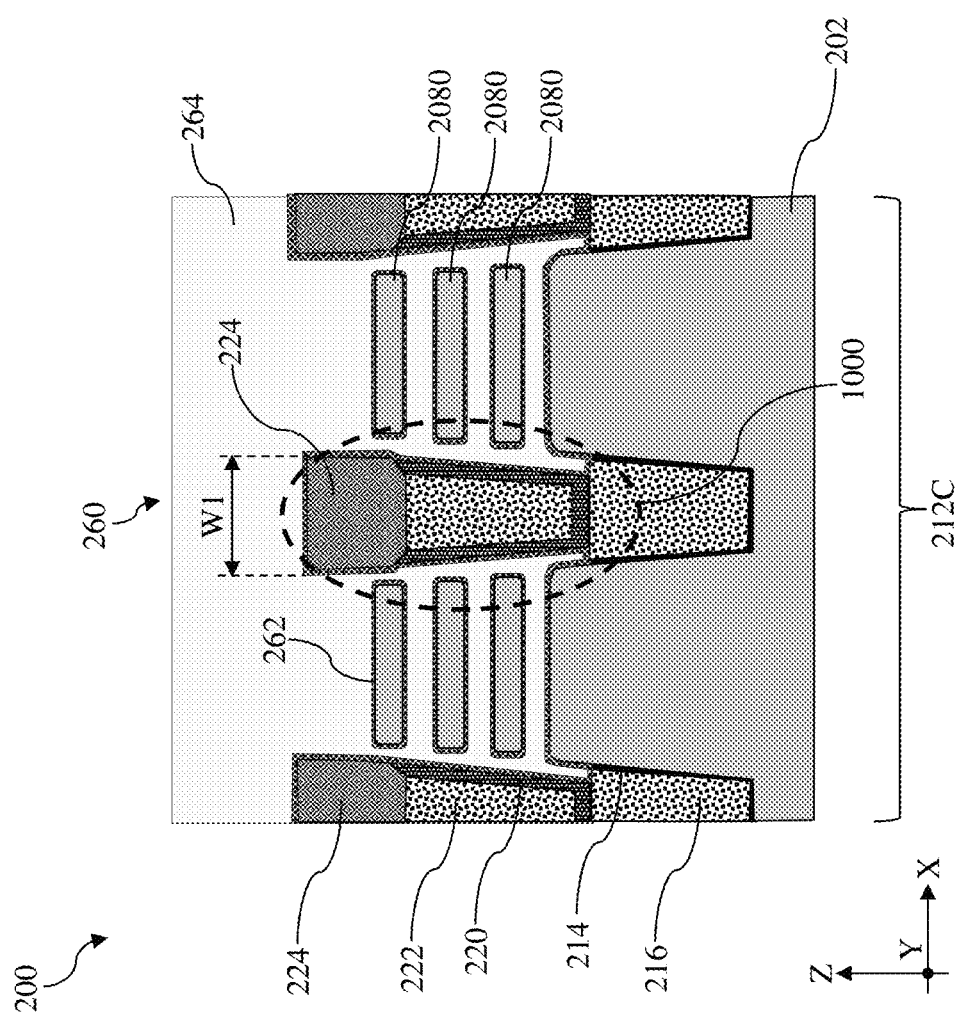

FIGS. 15-17 are fragmentary cross-sectional views of the workpiece 200. FIG. 15 is a cross-sectional view across section I-I' shown in FIG. 14. FIG. 16 is a cross-sectional view across section II-II' shown in FIG. 15, cutting through the source/drain region 212SD. FIG. 17 is a cross-sectional view across section III-III' shown in FIG. 15, cutting across the channel region 212C.

Referring to FIGS. 1, 15 and 16, method 100 includes a block 126 where the dummy gate stack 230 is removed. Operations at block 126 may include deposition of a contact etch stop layer (CESL) 250, deposition of an interlayer dielectric (ILD) layer 252 over the CESL 250, an anneal process, planarization of the workpiece 200, and selective removal of the dummy gate stack 230. In an example process, the CESL 250 is first conformally deposited over the workpiece 200 and then the ILD layer 252 is blanketly deposited over the CESL 250. The CESL 250 may include silicon nitride, silicon oxide, silicon oxynitride, and/or other materials known in the art. The CESL 250 may be deposited using ALD, plasma-enhanced chemical vapor deposition (PECVD) process and/or other suitable deposition or oxidation processes. In some embodiments, the ILD layer 252 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 252 may be deposited by spin-on coating, an FCVD process, or other suitable deposition technique. In some embodiments, after formation of the ILD layer 252, the workpiece 200 may be annealed to improve integrity of the ILD layer 252. To remove excess materials and to expose top surfaces of the dummy electrode 232 of the dummy gate stacks 230, a planarization process (such as chemical mechanical polishing (CMP) process) may be performed to the workpiece 200 to provide a planar top surface. Top surfaces of the dummy electrode 232 are exposed on the planar top surface.

While not explicitly shown in the figures, operations at block 126 also include selective removal of the dummy gate stack 230. After the dummy gate stack 230 is exposed by planarization, the dummy gate stack 230 is removed from the workpiece 200 by a selective etch process. The selective etch process may be a selective wet etch process, a selective dry etch process, or a combination thereof. In the depicted embodiments, the selective etch process selectively removes the dummy dielectric layer 231 and the dummy electrode 232 without substantially damaging the helmet layer 224 and the filler layer 222. The removal of the dummy gate stack 230 results in a gate trench over the channel regions.

Referring to FIGS. 1, 15 and 17, method 100 includes a block 128 where the sacrificial layers 206 and the cladding layer 218 in the channel region are removed to release channel members 2080. After the removal of the dummy gate stack 230, channel layers 208, sacrificial layers 206, and the cladding layer 218 in the channel region are exposed in the gate trenches. Due to their similar composition, the exposed sacrificial layers 206 between the channel layers 208 and the cladding layer 218 may be selectively removed to release the channel layers 208 to form channel members 2080, shown in FIGS. 15 and 17. The channel members 2080 are vertically stacked along the Z direction. The selective removal of the sacrificial layers 206 and the cladding layer 218 may be implemented by selective dry etch, selective wet etch, or other selective etch processes. In some embodiments, the selective wet etching includes an APM etch (e.g., ammonia hydroxide-hydrogen peroxide-water mixture). In some alternative embodiments, the selective removal includes silicon germanium oxidation followed by a silicon germanium oxide removal. For example, the oxidation may be provided by ozone clean and then silicon germanium oxide removed by an etchant such as $NH_4OH$. With the removal of the sacrificial layers 206 and the cladding layer 218 in the channel region, the liner 220, the channel members 2080, the top surface of the base portion 212B, and the isolation feature 216 are exposed in the gate trench. As shown in FIG. 15, when the bottom portion 3000 is too thick, the bottommost inner spacer feature 238 may not have sufficient thickness to withstand the selective etching at block 128. If the bottommost inner spacer feature 238 is damaged or etched through, the gate structure 260 may come in contact with or be shorted to the source/drain feature 240.

Referring to FIGS. 1, 15 and 17, method 100 includes a block 130 where a gate structure 260 is formed to wrap around each of the channel members 2080. The gate structure 260 may include a gate dielectric layer 262 on the channel members 2080 and the substrate 202 and a gate electrode layer 264 over the gate dielectric layer 262. The gate dielectric layer 262 may include an interfacial layer and a high-k dielectric layer. In some embodiments, the interfacial layer may include silicon oxide and may be formed as result of a pre-clean process. An example pre-clean process may include use of RCA SC-1 (ammonia, hydrogen peroxide and water) and/or RCA SC-2 (hydrochloric acid, hydrogen peroxide and water). The pre-clean process oxidizes the exposed surfaces of the channel members 2080 and the substrate 202 to form the interfacial layer. The high-k dielectric layer is then deposited over the interfacial layer using ALD, CVD, and/or other suitable methods. The high-k dielectric layer may include high-K dielectric materials. As used herein, high-k dielectric materials include dielectric materials having a high dielectric constant, for example, greater than that of thermal silicon oxide (~3.9). In one embodiment, the high-k dielectric layer may include hafnium oxide. Alternatively, the high-k dielectric layer may include other high-k dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material. After the formation or deposition of the gate dielectric layer 262, a gate electrode layer 264 is deposited over the gate dielectric layer 262. The gate electrode layer 264 may be a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer 264 may be formed by ALD, PVD, CVD, e-beam evaporation, or other suitable process. In various embodiments, a planarization process, such as a CMP process, may be performed to remove excessive materials to provide a substantially planar top surface of the gate structures. Referring to FIGS. 15 and 17, the gate structure 260 wraps around each of the channel members 2080. A lower portion of the gate structure 260 may be divided by the dielectric fin(s) 1000 into more than one segment.

FIG. 15 illustrates an MBC transistor 280 that includes vertically stacked channel members 2080 in the channel region 212C. The vertically stacked channel members 2080 extend between the source/drain features 240 in the source/drain regions 212SD. The gate structure 260 wraps around each of the vertically stacked channel members 2080. The trimmed helmet layer 224' with the second width W2 is shown in FIG. 16. Because the portion of the helmet layer 224 under the gate structure 260 is protected by the dummy gate stack 230 when the helmet layer 224 is selectively trimmed at block 116, the helmet layer 224 under the gate structure remains the first width W1 at its top surface, as shown in FIG. 17. The bottom portion 3000 of the cladding layer 218 borders the source/drain feature 240, the liner 220, the semiconductor liner 214, and the isolation feature 216, as illustrated in FIG. 16.

The present disclosure offers advantages over conventional processes. It is understood, however, that other embodiments may offer additional advantages, and not all advantages are necessarily disclosed herein, and that no particular advantage is required for all embodiments. For example, the processes disclosed in the present disclosure selectively trims a portion of a dielectric fin not covered by a dummy gate stack. The trimming reduces a width of the dielectric fin. The reduced width makes room for at least one gate spacer layer and prevents the at least one gate spacer layer from hindering the line-of-sight to anisotropically etch a cladding layer. As a result, the trimming of the dielectric fin allows a more complete removal of the cladding layer. A more complete removal of the cladding layer prevents insufficient thickness of inner spacer features, thereby reducing probability of shorting between the gate structure and the source/drain feature.

In one exemplary aspect, the present disclosure is directed to a semiconductor device. The semiconductor device includes a dielectric fin having a helmet layer, a gate structure disposed over a first portion of the helmet layer and extending along a direction, and a dielectric layer adjacent the gate structure and disposed over a second portion of the helmet layer. A width of the first portion along the direction is greater than a width of the second portion along the direction.

In some embodiments, the gate structure includes a gate dielectric layer and a gate electrode over the gate dielectric layer and the gate dielectric layer is in contact with the first portion of the helmet layer. In some implementations, the semiconductor device may further include a contact etch stop layer (CESL) disposed between the dielectric layer and the second portion of the helmet layer. In some instances, the helmet layer includes silicon nitride, silicon carbide, silicon carbonitride, silicon oxycarbonitride, aluminum oxide, aluminum nitride, aluminum oxynitride, zirconium oxide, zirconium nitride, zirconium aluminum oxide, or hafnium oxide. In some embodiments, the semiconductor device may further include a first plurality of channel members and a second plurality of channel members, a first source/drain feature coupled to the first plurality of channel members, and a second source/drain feature coupled to the second plurality of channel members. The gate structure wraps around each of the first plurality of channel members and the second plurality of channel members and the dielectric layer is disposed over the first source/drain feature and the second source/drain feature. In some embodiments, the dielectric fin is disposed between the first plurality of channel members and the second plurality of channel members and the dielectric fin is also disposed between the first source/drain feature and the second source/drain feature. In some instances, the dielectric fin is disposed over an isolation feature and a top surface of the isolation feature, a sidewall of the dielectric fin, and the first source/drain feature defines a space. In some embodiments, the space includes a semiconductor material. In some implementations, the semiconductor material includes silicon germanium.

In another exemplary aspect, the present disclosure is directed to a method. The method includes receiving a workpiece that includes a first fin-shaped structure and a second fin-shaped structure, the first fin-shaped structure and the second fin-shaped structure including a channel region and a source/drain region, and a dielectric fin disposed between the first fin-shaped structure and the second fin-shaped structure. The method further includes depositing a dummy gate stack over the channel region and a first portion of the dielectric fin, selectively etching a second portion of the dielectric fin not disposed under the dummy gate stack, after the selectively etching, depositing a gate spacer layer over sidewalls of the dummy gate stack and the second portion of the dielectric fin, and etching the source/drain region to form a source/drain opening.

In some embodiments, the dummy gate stack extends along a direction. After the selectively etching, a width of the first portion along the direction is greater than a width of the second portion along the direction. In some embodiments, the dielectric fin includes a helmet layer and the helmet layer includes silicon nitride, silicon carbide, silicon carbonitride, silicon oxycarbonitride, aluminum oxide, aluminum nitride, aluminum oxynitride, zirconium oxide, zirconium nitride, zirconium aluminum oxide, or hafnium oxide. In some implementations, the selectively etching etches the helmet layer. In some instances, the selectively etching etches the helmet layer. In some embodiments, the workpiece further includes a cladding layer disposed along sidewalls of the first fin-shaped structure and the second fin-shaped structure and the selectively etching is performed such that a portion of the helmet layer is below a top surface of the cladding layer.

In yet another exemplary aspect, the present disclosure is directed to a method. The method includes receiving a workpiece that includes a first fin-shaped structure and a second fin-shaped structure, the first fin-shaped structure and the second fin-shaped structure including a channel region and a source/drain region, an isolation feature disposed between the first fin-shaped structure and the second fin-shaped structure, a dielectric fin disposed over the isolation feature, a cladding layer disposed over sidewalls of the first fin-shaped structure and the second fin-shaped structure, and a dummy gate stack disposed over the channel region. The method may further include selectively etching a second portion of the dielectric fin while a first portion of the dielectric fin is covered by the dummy gate stack, after the selectively etching, depositing a gate spacer layer over sidewalls of the dummy gate stack and the second portion of the dielectric fin, etching the source/drain region and the cladding layer to form a source/drain opening, depositing a source/drain feature in the source/drain opening.

In some embodiments, the method may further include depositing a contact etch stop layer over the source/drain feature and the second portion of the dielectric fin, depositing a dielectric layer over the contact etch stop layer, and removing the dummy gate stack to expose the first portion of the dielectric fin, the cladding layer, sidewalls of the first fin-shaped structure, and sidewalls of the second fin-shaped structure. Each of the first fin-shaped structure and the second fin-shaped structure includes a plurality of channel layers interleaved by a plurality of sacrificial layers. In some embodiments, the method may further include, after the removing of the dummy gate stack, selectively removing the plurality of sacrificial layers to release the plurality of channel layers as channel members and forming a gate structure to wrap around each of the channel members. In some implementations, after the selectively etching, a width of the first portion is greater than a width of the second portion. In some instances, the dielectric fin includes a helmet layer and the helmet layer includes a high-k dielectric material.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a dielectric fin comprising a helmet layer;
a gate structure disposed over a first portion of the helmet layer and extending along a direction;
a dielectric layer adjacent the gate structure and disposed over a second portion of the helmet layer; and
a contact etch stop layer (CESL) disposed between the dielectric layer and the second portion of the helmet layer,
wherein a width of the first portion along the direction is greater than a width of the second portion along the direction.

2. The semiconductor device of claim 1,
wherein the gate structure comprises a gate dielectric layer and a gate electrode over the gate dielectric layer,
wherein the gate dielectric layer is in contact with the first portion of the helmet layer.

3. The semiconductor device of claim 1, wherein the helmet layer comprises silicon nitride, silicon carbide, silicon carbonitride, silicon oxycarbonitride, aluminum oxide, aluminum nitride, aluminum oxynitride, zirconium oxide, zirconium nitride, zirconium aluminum oxide, or hafnium oxide.

4. The semiconductor device of claim 1, further comprising:
a first plurality of channel members stacked one over another along the first direction and a second plurality of channel members stacked one over another along the first direction;
a first source/drain feature coupled to the first plurality of channel members; and
a second source/drain feature coupled to the second plurality of channel members,
wherein the gate structure wraps around each of the first plurality of channel members and the second plurality of channel members,
wherein the dielectric layer is disposed over the first source/drain feature and the second source/drain feature.

5. The semiconductor device of claim 4,
wherein the dielectric fin is disposed between the first plurality of channel members and the second plurality of channel members,
wherein the dielectric fin is also disposed between the first source/drain feature and the second source/drain feature.

6. The semiconductor device of claim 4,
wherein the dielectric fin is disposed over an isolation feature,
wherein a top surface of the isolation feature, a sidewall of the dielectric fin, and the first source/drain feature defines a space.

7. The semiconductor device of claim 6, wherein the space comprises a semiconductor material.

8. The semiconductor device of claim 7, wherein the semiconductor material comprises silicon germanium.

9. A semiconductor structure, comprising:
a substrate;
an isolation feature partially extending into the substrate;
a dielectric fin disposed directly over the isolation feature; and
a source/drain feature adjacent the isolation feature and the dielectric fin, wherein the dielectric fin comprises:
an outer layer in contact with a top surface of the isolation feature and the source/drain feature,
an inner layer spaced apart from the top surface of the isolation feature and the source/drain feature by the outer layer, and
a helmet feature disposed on the outer layer and the inner layer,
wherein the helmet feature comprises a top width and a bottom width greater than the top width.

10. The semiconductor structure of claim 9, wherein the source/drain feature is in contact with the helmet feature.

11. The semiconductor structure of claim 9, further comprising:
a silicon germanium feature disposed at a corner defined by a sidewall of the dielectric fin and the top surface of the isolation feature.

12. The semiconductor structure of claim 11, wherein the silicon germanium feature is in contact with the source/drain feature.

13. The semiconductor structure of claim 9, further comprising:
a semiconductor liner disposed between the isolation feature and the substrate and between the isolation feature and the source/drain feature.

14. The semiconductor structure of claim 9, wherein the helmet feature comprises silicon nitride, silicon carbide, silicon carbonitride, silicon oxycarbonitride, aluminum oxide, aluminum nitride, aluminum oxynitride, zirconium oxide, zirconium nitride, zirconium aluminum oxide, or hafnium oxide.

15. A semiconductor structure, comprising:
a substrate;
a gate structure extending along a first direction;
a first source/drain feature and a second source/drain feature adjacent the gate structure; and
a dielectric fin extending away from the substrate along a vertical direction and lengthwise along a second direction perpendicular to the first direction, the dielectric fin comprising a first lengthwise portion disposed within the gate structure and a second lengthwise portion disposed between the first source/drain feature and the second source/drain feature,
wherein a top width of the first lengthwise portion is greater than a top width of the second lengthwise portion,
wherein the dielectric fin is formed of dielectric materials.

16. The semiconductor structure of claim 15, wherein the dielectric fin comprises:
an outer layer in contact with the first source/drain feature and the second source/drain feature, an inner layer spaced apart from the first source/drain feature and the second source/drain feature by the outer layer, and a helmet feature disposed on the outer layer and the inner layer.

17. The semiconductor structure of claim 16, further comprising:

an isolation feature, wherein the dielectric fin is disposed on the isolation feature such that the outer layer is in contact with the isolation feature.

18. The semiconductor structure of claim 17, further comprising:

a silicon germanium feature disposed at a corner defined by a sidewall of the dielectric fin and a top surface of the isolation feature.

19. The semiconductor structure of claim 18, wherein the silicon germanium feature is in contact with the first source/drain feature.

20. The semiconductor structure of claim 15, further comprising:

a dielectric layer adjacent the gate structure and disposed over the second lengthwise portion; and a contact etch stop layer (CESL) disposed between the dielectric layer and the second lengthwise portion.

* * * * *